(12) United States Patent
Kaps et al.

(10) Patent No.: US 8,581,133 B2
(45) Date of Patent: Nov. 12, 2013

(54) OPERATOR CONTROL APPARATUS OF AN ELECTRONIC DOMESTIC APPLIANCE AND METHOD OF PRODUCING THE OPERATOR CONTROL APPARATUS

(75) Inventors: Werner Kaps, Weiler-Simmerberg (DE); Thomas Frommelt, Munich (DE)

(73) Assignee: Diehl AKO Stiftung & Co. KG, Wangen/BRD (DE)

( * ) Notice: Subject to any disclaimer, the term of this patent is extended or adjusted under 35 U.S.C. 154(b) by 311 days.

(21) Appl. No.: 12/912,331

(22) Filed: Oct. 26, 2010

(65) Prior Publication Data
US 2011/0094870 A1    Apr. 28, 2011

(30) Foreign Application Priority Data
Oct. 28, 2009 (DE) .......................... 10 2009 050 958

(51) Int. Cl.
*H03K 17/975* (2006.01)

(52) U.S. Cl.
USPC .......................... 200/600; 200/512; 345/173

(58) Field of Classification Search
USPC ......... 200/5 A, 600, 511, 512, 293, 296, 310, 200/314; 341/22, 32, 33; 345/168–170, 345/173–176
See application file for complete search history.

(56) References Cited

U.S. PATENT DOCUMENTS

| | | | | |
|---|---|---|---|---|
| 5,917,165 A * | 6/1999 | Platt et al. | ...................... | 200/600 |
| 6,664,489 B2 * | 12/2003 | Kleinhans et al. | ............. | 200/313 |
| 6,771,327 B2 * | 8/2004 | Sekiguchi | ........................ | 349/12 |
| 6,794,728 B1 * | 9/2004 | Kithil | ........................... | 257/532 |
| 7,507,929 B2 | 3/2009 | Streifler | | |
| 8,178,936 B2 * | 5/2012 | Zhe et al. | ....................... | 257/416 |
| 2007/0030254 A1 | 2/2007 | Robrecht et al. | | |
| 2007/0095643 A1 * | 5/2007 | Weiss et al. | ..................... | 200/511 |
| 2008/0142352 A1 * | 6/2008 | Wright | ........................... | 200/600 |
| 2009/0115645 A1 | 5/2009 | Roth | | |
| 2009/0322696 A1 * | 12/2009 | Yaakoby et al. | .............. | 345/173 |
| 2010/0007531 A1 | 1/2010 | Fluhrer | | |
| 2010/0078304 A1 | 4/2010 | Kaps et al. | | |
| 2011/0141056 A1 * | 6/2011 | Nishiyama | ..................... | 345/174 |
| 2011/0291978 A1 * | 12/2011 | Ho et al. | ....................... | 345/173 |

FOREIGN PATENT DOCUMENTS

| | | |
|---|---|---|
| CN | 101228498 A | 7/2008 |
| CN | 101444000 A | 5/2009 |
| CN | 101640528 A | 2/2010 |
| DE | 19706168 A1 | 8/1998 |
| DE | 20119700 U1 | 2/2002 |
| DE | 10123633 A1 | 2/2003 |
| DE | 10326684 A1 | 12/2004 |
| DE | 102008049176 A1 | 4/2010 |
| WO | WO 9830967 A2 * | 7/1998 |

* cited by examiner

*Primary Examiner* — R S Luebke
*Assistant Examiner* — Lheiren Mae Caroc
(74) *Attorney, Agent, or Firm* — Laurence A. Greenberg; Werner H. Stemer; Ralph E. Locher

(57) ABSTRACT

An operator control apparatus of an electronic domestic appliance contains an operator control panel on that side of the operator control apparatus which faces a user, at least one electrically conductive sensor element on that side of the operator control panel which is averted from the user, and a printed circuit board with at least one electrically conductive contact area which is arranged on that side of the printed circuit board which faces the operator control panel so as to be associated with the at least one sensor element. In this case, the at least one sensor element and the at least one contact area of the printed circuit board are connected to one another by an adhesive which is electrically conductive at least in the connection direction.

8 Claims, 1 Drawing Sheet

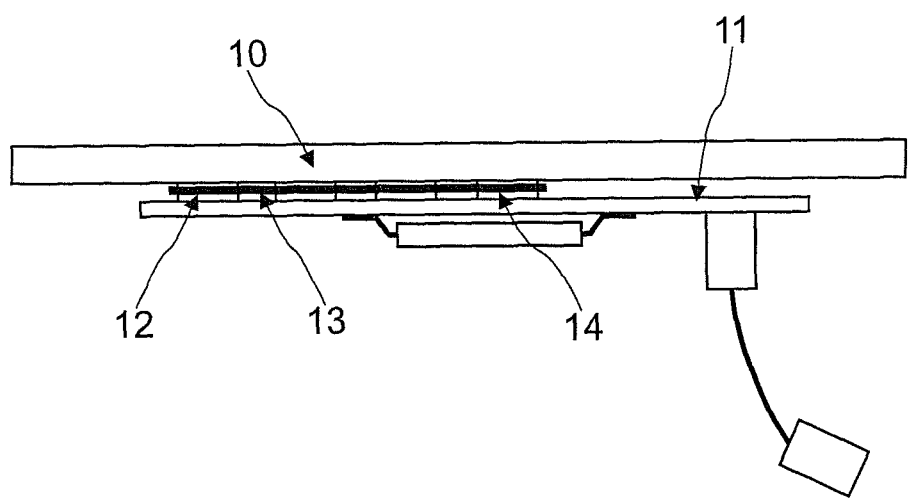

OPERATOR CONTROL APPARATUS OF AN ELECTRONIC DOMESTIC APPLIANCE AND METHOD OF PRODUCING THE OPERATOR CONTROL APPARATUS

CROSS-REFERENCE TO RELATED APPLICATION

This application claims the priority, under 35 U.S.C. §119, of German application DE 10 2009 050 958.5, filed Oct. 28, 2009; the prior application is herewith incorporated by reference in its entirety.

BACKGROUND OF THE INVENTION

Field of the Invention

The present invention relates to an operator control apparatus of an electronic domestic appliance and also to a method for producing an operator control apparatus of this kind.

Operator control apparatuses for electronic domestic appliances are more and more frequently being equipped with touch-sensitive touch-operated switches which are based on an optical, capacitive or inductive effect. In the case of capacitive or inductive touch-operated switches, a corresponding, electrically conductive sensor element is usually arranged on the rear face of an operator control panel which is averted from the user, the sensor element being electrically conductively connected to an associated contact area on a printed circuit board which is arranged behind the operator control panel. The printed circuit board is part of a control and/or evaluation electronics system or is connected to such a system.

In operator control apparatuses of this kind, the electrically conductive connection between the sensor element of the touch-operated switch and the contact area on the printed circuit board is conventionally produced by mechanical components, for example metallic spring elements. These spring elements are supported directly against the contact area and the sensor element and are partly additionally fixed (for example by clamping, locking, soldering etc.).

The operator control apparatuses constructed in this way therefore require special mechanical connection elements which contain an electrically conductive material and have to be produced, inserted and possibly additionally fixed. In addition, the functionality of the connection elements can reduce over the operating time due to thermal and mechanical loading; this is particularly true when spring elements are used for these components.

SUMMARY OF THE INVENTION

It is accordingly an object of the invention to provide an operator control apparatus of an electronic domestic appliance that overcome the above-mentioned disadvantages of the prior art devices and methods of this general type, which ensures long-term functionality and is simple to produce.

The operator control apparatus of an electronic domestic appliance has an operator control panel on that side of the operator control apparatus which faces a user; at least one electrically conductive sensor element on that side of the operator control panel which is averted from the user; and a printed circuit board with at least one electrically conductive contact area which is arranged on that side of the printed circuit board which faces the operator control panel so as to be associated with the at least one sensor element. According to the invention, the operator control apparatus is characterized in that the at least one sensor element and the at least one contact area of the printed circuit board are connected by an adhesive which is electrically conductive at least in the connection direction.

In contrast to the conventional operator control apparatuses, in which the sensor elements of the touch-sensitive touch-operated switches and the contact areas of the printed circuit board are connected to one another by mechanical components, according to the invention the sensor elements and the contact areas are connected to one another by an adhesive which is electrically conductive at least in the connection direction.

One or more of the following advantages can be achieved by way of this measure—depending on the specific refinement of the operator control apparatus of the electronic domestic appliance.

By using the adhesive for the mechanical fixing and the electrically conductive connection, the need for further additional components is dispensed with. This reduces the number of components and therefore reduces the costs of production and the complexity of production.

Additional mechanical fixing of a connection element is dispensed with. In the case of the operator control apparatus according to the invention, the mechanical fixing and the electrically conductive connection are effected at the same time by the adhesive.

The use of the adhesive permits compensation of manufacturing and positioning tolerances of the operator control panel and of the sensor element on the one hand and of the printed circuit board and of the contact area on the other.

The adhesive connection can also be applied in a simple manner to curved operator control panels and curved printed circuit boards.

The use of the adhesive permits an electrically conductive connection between the sensor elements and the contact areas which is functional over the long term.

The adhesive connection often has a certain degree of elasticity, and therefore it can still maintain its functionality reliably over the long term under thermal and mechanical influences.

In addition, the adhesive bonding technique has the advantage over soldering that the maximum temperatures which occur are lower, and therefore the risk of damaging or destroying electronic components is significantly lower.

The adhesive which is electrically conductive at least in the connection direction can be, for example, a so-called conductive adhesive. Both isotropic conductive adhesives and also anisotropic conductive adhesives can be used in this case. Conductive adhesives consist, for example, of a polymer matrix which contains electrically conductive, metallic or non-metallic fillers (for example precious metal powders such as silver).

The operator control apparatus can advantageously be used in electronic domestic appliances such as cookers, hobs, microwave ovens, washing machines, tumble dryers, dishwashers and the like.

In one refinement of the invention, the adhesive substantially contains a material which hardens under pressure and/or temperature effects.

In a further refinement of the invention, the adhesive has the form of an adhesive film, an adhesive tape or an adhesive paste.

The invention can advantageously be applied to an operator control apparatus in which the at least one sensor element is a capacitive or inductive sensor element, and the printed circuit board is provided with or connected to a control and/or evaluation electronics system.

According to a second aspect of the invention, the above-mentioned object is solved by a method for producing an operator control apparatus for an electronic domestic appliance.

The method for producing an operator control apparatus of an electronic domestic appliance contains the steps of providing an operator control panel; providing at least one electrically conductive sensor element on that side of the operator control panel which is averted from a user; and providing a printed circuit board with at least one electrically conductive contact area which is arranged on that side of the printed circuit board which faces the operator control panel so as to be associated with the at least one sensor element. According to the invention, the method is characterized in that the at least one sensor element and the at least one contact area of the printed circuit board are connected by an adhesive which is electrically conductive at least in the connection direction.

The advantages which can be achieved by this method correspond to the advantages cited above in connection with the operator control apparatus according to the invention.

Other features which are considered as characteristic for the invention are set forth in the appended claims.

Although the invention is illustrated and described herein as embodied in an operator control apparatus of an electronic domestic appliance and a method of producing the operator control apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a schematic illustration of the design of an operator control apparatus of an electronic domestic appliance according to the invention.

DETAILED DESCRIPTION OF THE INVENTION

Referring now to the single FIGURE of the drawing in detail, there is shown an operator control apparatus having an operator control panel 10 of an electronic domestic appliance. The FIGURE illustrates an operator control apparatus with a flat operator control panel 10, but curved operator control panels 10 can also be used. Furthermore, the operator control panel 10 can be a panel which is composed of a transparent, a partially transparent or an opaque material.

A plurality of touch-sensitive touch-operated switches which have capacitive or inductive sensors are integrated in the operator control apparatus. These sensors usually each have at least one electrically conductive sensor element 12 on the rear face of the operator control panel 10 which is averted from the user (at the bottom in the FIGURE).

The sensor elements 12 are in contact with electrically conductive contact areas 14 on a printed circuit board 11 which is arranged on that side which is averted from the user, behind the operator control panel 10. The printed circuit board 11 is provided with or connected to a control and/or evaluation electronics system, for example in the form of a conversion electronics system or the like. The printed circuit board 11 can also be regarded as a constituent part of the control and/or evaluation electronics system.

The electrically conductive connection and the mechanical fixing between the at least one sensor element 12 and the at least one contact area 14 of the printed circuit board 11 is established by an adhesive 13 which is electrically conductive at least in the connection direction (direction from top to bottom in the FIGURE). The adhesive 13 has to be electrically conductive at least in the connection direction, that is to say in the thickness direction of the film or of the tape, and can, in particular, also be electrically conductive in all directions.

The adhesive 13 is, for example, an isotropic or anisotropic conductive adhesive which is present in the form of an adhesive film, an adhesive tape or an adhesive paste. The conductive adhesive is typically a polymer matrix which contains electrically conductive, metallic or non-metallic fillers. The filler may be, for example, a precious metal powder, for example silver particles.

The adhesive 13 is initially applied in the region between the sensor element 12 and the contact area 14. The adhesive is then hardened under a predetermined pressure and/or at a predetermined temperature for a predetermined period of time in order to establish a long-term connection. As a result, the electrical and mechanical connection between the sensor element 12 and the contact area 14 remains functional over the long term in spite of subsequent thermal and mechanical influences.

By virtue of the adhesive 13, additional mechanical fixing processes of a mechanical connection element and further process steps can be avoided and manufacturing tolerances of the components and positioning inaccuracies during assembly can be compensated for, and possibly curved surfaces can be connected to one another.

The invention claimed is:

1. An operator control apparatus for an electronic domestic appliance, the operator control apparatus comprising:
    an operator control panel on that side of the operator control apparatus facing a user;
    at least one sensor having at least one electrically conductive sensor element on that side of said operator control panel averted from the user;
    an adhesive; and
    a printed circuit board having at least one electrically conductive contact area disposed on that side of said printed circuit board facing said operator control panel so as to be associated with said at least one sensor element, said at least one sensor element and said at least one contact area of said printed circuit board connected by said adhesive, said adhesive being electrically conductive only in a connection direction.

2. The operator control apparatus according to claim 1, wherein said adhesive substantially contains a material which hardens under at least one of pressure or temperature effects.

3. The operator control apparatus according to claim 1, wherein said adhesive is selected from the group consisting of an adhesive film, an adhesive tape and an adhesive paste.

4. The operator control apparatus according to claim 1, wherein said at least one sensor is selected from the group consisting of capacitive sensors and inductive sensors and said printed circuit board is provided with or connected to a control electronics system.

5. A method for producing an operator control apparatus of an electronic domestic appliance, which comprises the steps of:
    providing an operator control panel;
    providing at least one sensor having at least one electrically conductive sensor element on that side of the operator control panel averted from a user; and providing a printed circuit board with at least one electrically conductive contact area disposed on that side of the printed circuit board facing the operator control panel so as to be associated with the at least one sensor element, the at least one sensor element and the at least one contact area of the printed circuit board connected by means of an adhesive being electrically conductive only in a connection direction.

6. The method according to claim 5, which further comprises substantially hardening the adhesive under pressure, with temperature or with a combination of pressure and temperature.

7. The method according to claim 5, which further comprises selecting the adhesive from the group consisting of an adhesive film, an adhesive tape and an adhesive paste.

8. The method according to claim 5, which further comprises:
- selecting the at least one sensor from the group consisting of capacitive sensors and inductive sensors; and
- providing the printed circuit board with or connected to a control electronics system.

\* \* \* \* \*